United States Patent
Aoki et al.

(10) Patent No.: US 6,892,214 B2
(45) Date of Patent: May 10, 2005

(54) DIGITAL FILTER AND METHOD FOR PRODUCING AN OUTPUT BY MULTIPLYING AN INPUT DATA UNIT ONLY ONCE BY A COEFFICIENT

(75) Inventors: Sachiyo Aoki, Tokyo (JP); Akio Ohba, Kanagawa (JP)

(73) Assignee: Sony Computer Entertainment Inc. (JP)

( * ) Notice: Subject to any disclaimer, the term of this patent is extended or adjusted under 35 U.S.C. 154(b) by 450 days.

(21) Appl. No.: 09/797,873

(22) Filed: Mar. 2, 2001

(65) Prior Publication Data

US 2001/0039556 A1 Nov. 8, 2001

(30) Foreign Application Priority Data

Mar. 3, 2000 (JP) ........................................ 2000-059349

(51) Int. Cl.[7] .............................................. G06F 17/10
(52) U.S. Cl. ........................................................ 708/319
(58) Field of Search ............................................ 708/319

(56) References Cited

U.S. PATENT DOCUMENTS

| | | | |
|---|---|---|---|
| 5,146,470 A | * 9/1992 | Fujii et al. .................. | 375/350 |
| 5,262,972 A | * 11/1993 | Holden et al. ............... | 708/316 |
| 5,282,155 A | * 1/1994 | Jones ........................ | 708/322 |
| 5,740,343 A | 4/1998 | Tarolli et al. | |
| 5,774,125 A | 6/1998 | Suzuoki et al. ............. | 345/430 |
| 5,798,954 A | 8/1998 | Ishibata | |
| 6,005,584 A | 12/1999 | Kitamura et al. ........... | 345/430 |

FOREIGN PATENT DOCUMENTS

| | | |
|---|---|---|
| CN | 1158515 A1 | 9/1997 |
| JP | 61-123274 | 6/1986 |
| JP | 61-189719 | 8/1986 |
| JP | 61 61876 | 6/1994 |
| JP | 10 177656 | 6/1998 |
| JP | H11-501428 A1 | 2/1999 |

OTHER PUBLICATIONS

Copy of Official Action dated Mar. 16, 2004 and its English translation in Japanese patent application No. 2000–059349, which is a counterpart of the present application.
Jain, A.K.; "Fundamentals Of Digital Image Processing", 1989, Prentice Hall, Englewood Cliffs, NJ, USA, pp. 252–253.
Ramponi, G. et al.; "Nonlinear Unsharp Masking Methods For Image Contrast Enhancement", Journal of Electronic Imaging, Jul. 1996, vol. 5, No. 3, pp. 353–366.

* cited by examiner

*Primary Examiner*—D. H. Malzahn
(74) *Attorney, Agent, or Firm*—Lerner, David, Littenberg, Krumholz & Mentlik, LLP

(57) ABSTRACT

This invention provides a digital filter which permits input data to be little canceled. Based on an input signal, a coefficient is calculated through delay units 10, 11, coefficient multiplier units 20, 21, 22, adder units 30, 31, 32 and an offset constant unit 40, and the thus obtained coefficient is multiplied by the input signal through coefficient multiplier unit 23.

16 Claims, 9 Drawing Sheets

FIG.8 conv_filter()

{ f = EDGE-ENHANCING COEFFICIENT (0 TO 128) ← S1

OFFX=OFFY=0;
    Set_dRGB_Plane(OFFX,OFFY,128); ← S2

OFFX=-1;
    Sub_dRGB_Plane_sY(OFFX,OFFY,f); ← S3

OFFX=0;
    Add_dRGB_Plane_sY(OFFX,OFFY,f); ← S4

OFFX=1;
    Sub_dRGB_Plane_sY(OFFX,OFFY,f); ← S5

OFFX=0;
    Add_dRGB_Plane_sY(OFFX,OFFY,f); ← S6

Mov_dG_dA(); ← S7

Mul_dA_Plane_sRGB(OFFX,OFFY,128); ← S8

}

DIGITAL FILTER AND METHOD FOR PRODUCING AN OUTPUT BY MULTIPLYING AN INPUT DATA UNIT ONLY ONCE BY A COEFFICIENT

This application claims a priority based on Japanese Patent Application No. 2000-59349 filed on Mar. 3, 2000, the entire contents of which are incorporated herein by reference for all purposes.

BACKGROUND OF THE INVENTION

This invention relates to a digital filter and, particularly, to a digital filter used for an image processing.

Digital filters such as convolution (convolutional processing) filter and the like filters have heretofore been used for an image processing.

FIG. 9 is a diagram illustrating the constitution of a conventional digital filter which includes delay units 910, 911, coefficient multiplier units 920, 921, 922 and adder units 930, 931. In this digital filter, an input signal and a signal obtained by delaying the input signal are multiplied by a predetermined coefficient, and an added result thereof is produced as an output signal.

SUMMARY OF THE INVENTION

The digital filter repeats the sum-of-product operation in the process of calculation. Unless the calculation is conducted maintaining a sufficient degree of calculation precision (calculated word length), therefore, there often occurs cancellation of significant digits. In FIG. 9, for example, the cancellation occurs unless the operation units 920, 921, 922, 930, 931 and the region for holding intermediate data 950, 951 during the calculation have a sufficient word length. If such a digital filter is used for an image processing, therefore, the original image can not be reproduced in detail, and vivid gradation of the image is not obtainable.

It is therefore an object of this invention to provide a digital filter which permits the input data to be little canceled even by using an operation unit operating with a short word length.

A digital filter according to this invention comprises a filter operation unit for calculating a coefficient by effecting a sum-of-product operation for input data, and a multiplier unit for multiplying the coefficient calculated by the filter operation unit by the input data.

A filter processing method according to this invention comprises calculating a coefficient by executing a sum-of-product operation for input data, multiplying the calculated coefficient by the input data, and producing the multiplied result as output data.

A recording medium according to the invention is the one that records a program for effecting the filtering for image data. The program has a step of calculating a coefficient by executing a sum-of-product operation for the image data, a step of multiplying the calculated coefficient by the image data, and a step of producing the multiplied result.

The program can be distributed with a portable recording medium such as CD-ROM, DVD-ROM or memory card, or through a network.

An entertainment device according to this invention includes a drawing operation unit and a drawing memory. The drawing memory includes a drawing region and a texture region. The drawing operation unit includes a texture mapping unit and a blending unit. The texture mapping unit executes texture mapping by using, as texture data, the image data stored in the texture region. The blending unit executes a mixed mode operation between the data after the texture-mapping and the data stored in the drawing region, stores the result in the drawing region thereby to calculate a coefficient used for image filter processing, and finds a product of the thus calculated coefficient and the image data.

BRIEF DESCRIPTION OF THE DRAWINGS

FIG. 8 is a diagram illustrating specific examples of instructions sent to the graphic processor 110 from the main CPU 100.

DESCRIPTION OF THE PREFERRED EMBODIMENT

Embodiments of the invention will now be described in detail with reference to the drawings.

Figure 1:
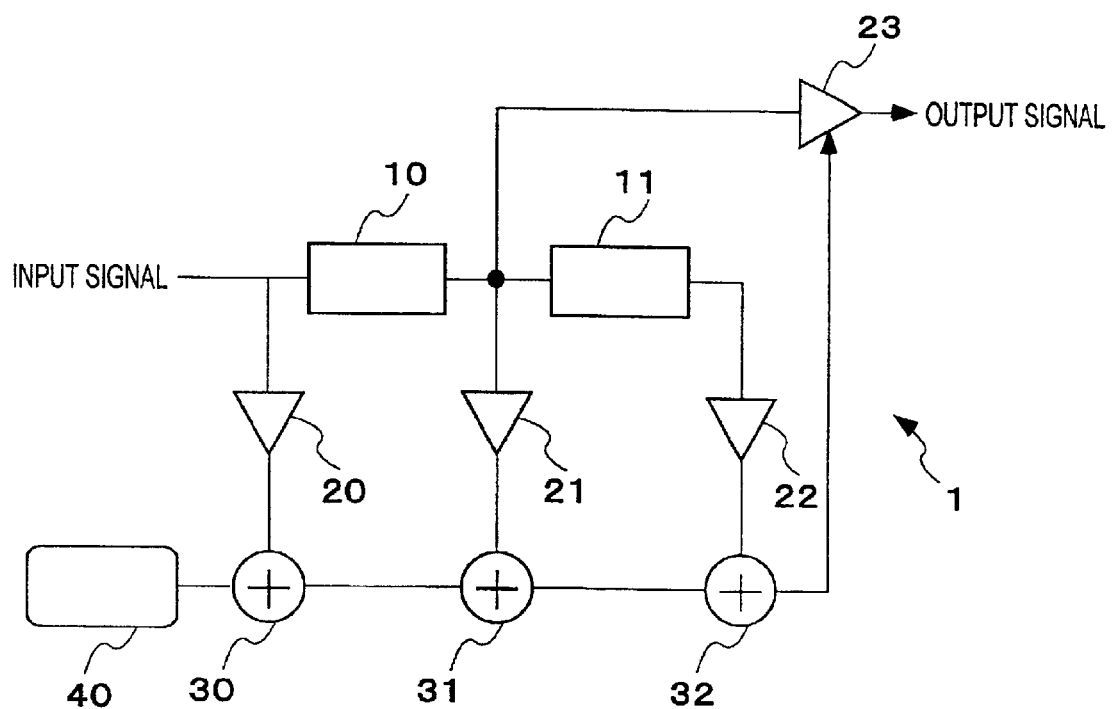
FIG. 1 is a diagram illustrating the constitution of a digital filter according to this invention.

FIG. 1 is a diagram illustrating the constitution of a digital filter according to this invention. As shown in FIG. 1, a digital filter 1 includes delay units 10, 11, coefficient multiplier units 20, 21, 22, 23, adder units 30, 31, 32, and an offset constant unit 40.

In the digital filter 1, first, an input signal is subjected to a filtering operation (sum-of-product operation) through the delay units 10, 11, coefficient multiplier units 20, 21, 22, adder units 30, 31, 32 and offset constant unit 40, thereby to find a coefficient. The thus found coefficient is multiplied by the original data through the coefficient multiplier unit 23 to obtain an output signal.

Figure 9:
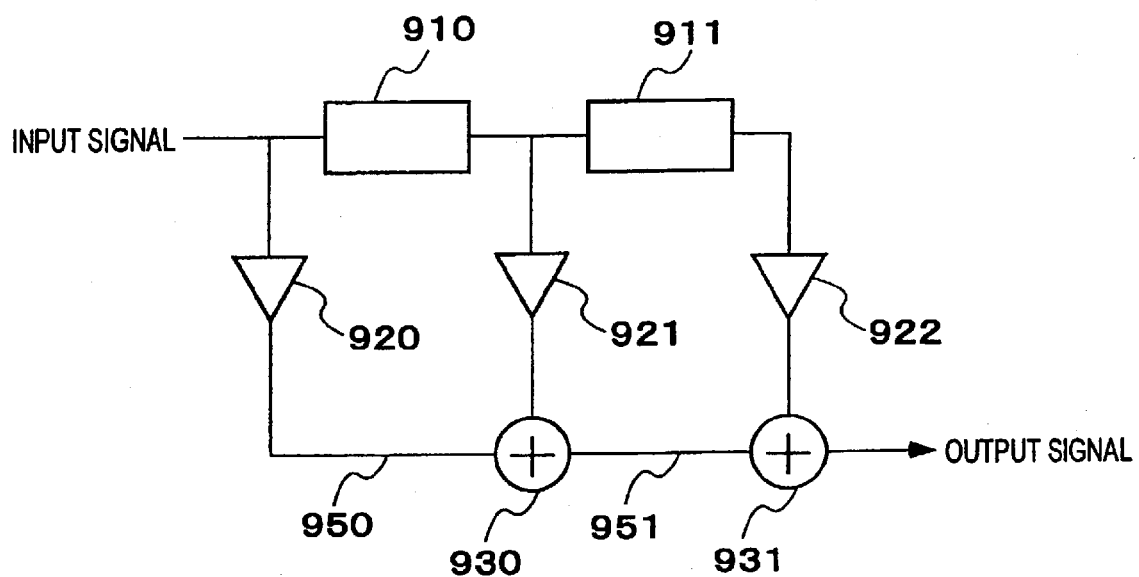
FIG. 9 is a diagram illustrating the constitution of a conventional digital filter.

Therefore, the digital filter 1 firstly finds the coefficient from the input signal, and multiplies the original data by the coefficient in the final stage. Thus, the original data is multiplied only once in the final stage, and becomes little likely to be canceled. When used for image processing, therefore, the original signals are reproducible in more detail compared to that of using the conventional digital filter shown in FIG. 9, and clear image gradation is accomplished.

Next, described below are specific embodiments of the digital filter according to this invention. The following description is concerned with an edge-enhancing filter for enhancing the edge in the reproduced output during the DVD video reproduction.

The edge-enhancing filter is for enhancing the edge of the reproduced DVD video image to meet the linking of a user.

First, described below is an entertainment device on which the edge-enhancing filter is mounted.

Figure 2:
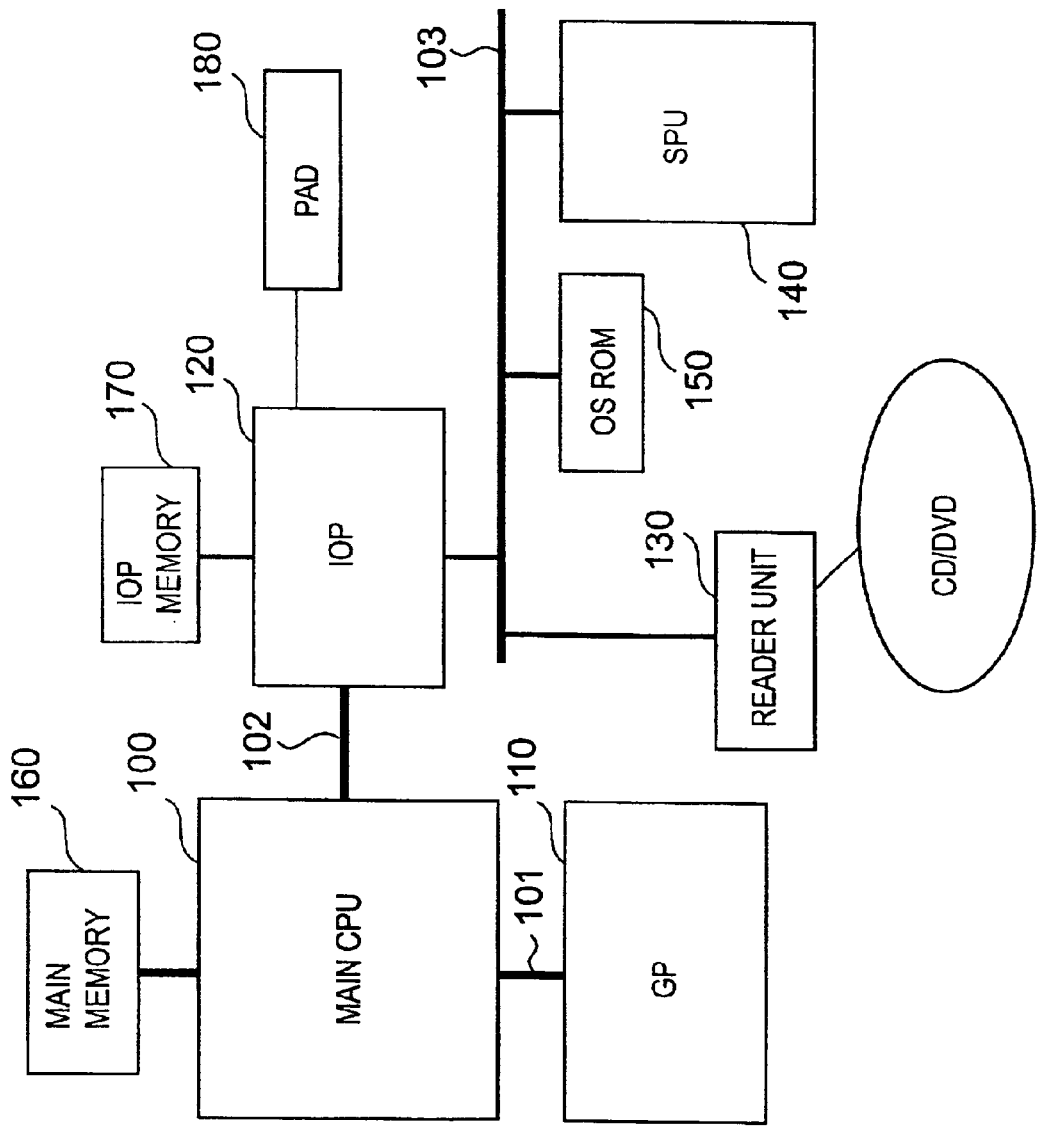
FIG. 2 is a block diagram illustrating the constitution of an entertainment device mounting the digital filter of this invention.

FIG. 2 is a block diagram illustrating the constitution of the entertainment device to which this invention is applied.

The entertainment device executes a game fed by CD/DVD and reproduces the DVD video supplied by DVD.

As shown in FIG. 2, the entertainment device includes a main CPU 100, a graphic processor (GP) 110, an IOP 120, a CD/DVD reader unit 130, an SPU 140, an OSROM 150, a main memory 160, and an IOP memory 170.

The main CPU 100 and the graphic processor 110 are connected together through a dedicated bus 101. The main CPU 100 and the IOP 120 are connected together through a bus 102. Further, the IOP 120, CD/DVD reader unit 130, SPU 140 and OSROM 150 are connected to a bus 103.

The main memory 160 is connected to the main CPU 100, and the IOP memory 170 is connected to the IOP 120. A controller (PAD) 180 is connected to the IOP 120.

The main CPU 100 executes a predetermined processing by executing a program stored in the OSROM 150 and by executing a program loaded onto the main memory 160 from a CD or a DVD (or a memory card that is not shown).

The graphic processor 110 is a drawing processor which takes over the job of a rendering function of the entertainment device, and executes drawing processing according to instructions from the main CPU 100.

The IOP 120 is an input/output sub-processor for controlling the exchange of data between the main CPU 100 and peripheral equipment (CD/DVD reader unit 130, SPU 140, etc.).

The CD/DVD reader unit 130 reads data from the CD and DVD, and transfers the data to the main memory 160.

The SPU 140 is a sound reproduction processor and reproduces the compressed waveform data stored in the sound buffer (not shown) at a predetermined sampling frequency based upon a sounding instruction from the main CPU 100 or the like.

The OSROM 150 is a ROM storing a program executed by the main CPU 100 and the IOP 120 at the starting.

The main memory 160 is a main memory for the main CPU 100, and stores instructions executed by the main CPU 100 and data utilized by the main CPU 100.

The IOP memory 170 is a main memory for the IOP 120, and stores instructions executed by the IOP 120 and data utilized by the IOP 120.

The controller (PAD) 180 is an interface for transmitting the will of the player to the application and the like while playing the game and the like.

In the thus constituted entertainment device, the edge-enhancing filter which enhances the edge for the DVD video output by utilizing the drawing function of the graphic processor 110 is mounted.

Described below is the edge-enhancing filter processing executed by utilizing the graphic processor 110 during the DVD video reproduction.

First, described below is the internal constitution of the graphic processor 110 used for mounting the edge-enhancing filter of the invention.

Figure 3:
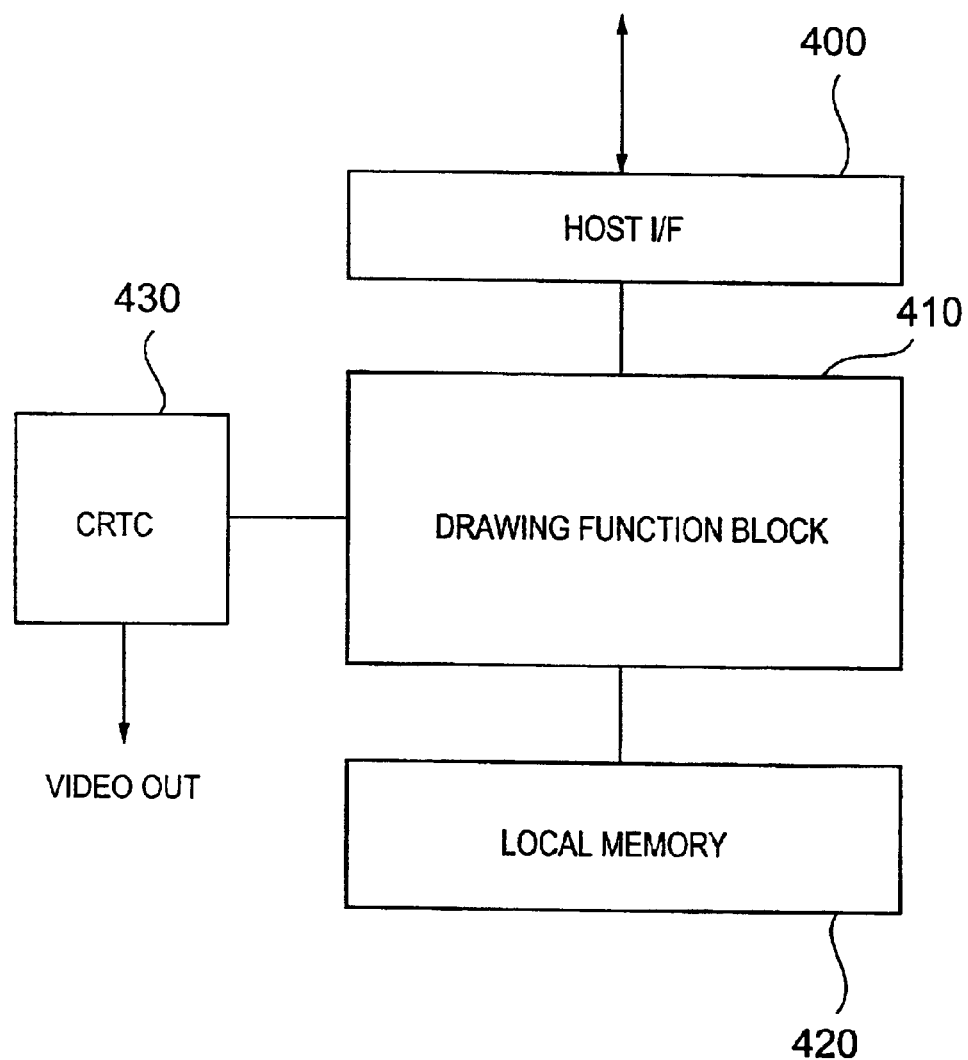
FIG. 3 is a diagram illustrating the internal constitution of a graphic processor 110.

FIG. 3 is a diagram illustrating the internal constitution of the graphic processor 110. As shown in FIG. 3, the graphic processor 110 includes a host interface unit 400, a drawing function block 410, a local memory 420 and a CRTC unit 430.

The host interface unit 400 works to exchange the data relative to the main CPU 100.

The drawing function block 410 is a logic circuit unit that executes rendering in response to instructions from the main CPU 100. The drawing function block 410 includes 16 digital differential analyzers (DDAs) and 16 pixel engines, and processes in parallel a maximum of 16 pixel data of 64 bits (32 bits of color data and 32 bits of Z value). The DDAs calculate RGB values, Z values, texture values and the like. Based upon these data, the pixel engines form final pixel data.

The local memory 420 stores the pixel data formed by the drawing function block 410 and the texture data transferred from the main CPU 100.

The CRTC unit 430 outputs, as video signals, the content of the frame buffer region of the local memory 420 according to an output format (NTSC, PAL, VESA format, etc.) that is specified.

Figure 4:
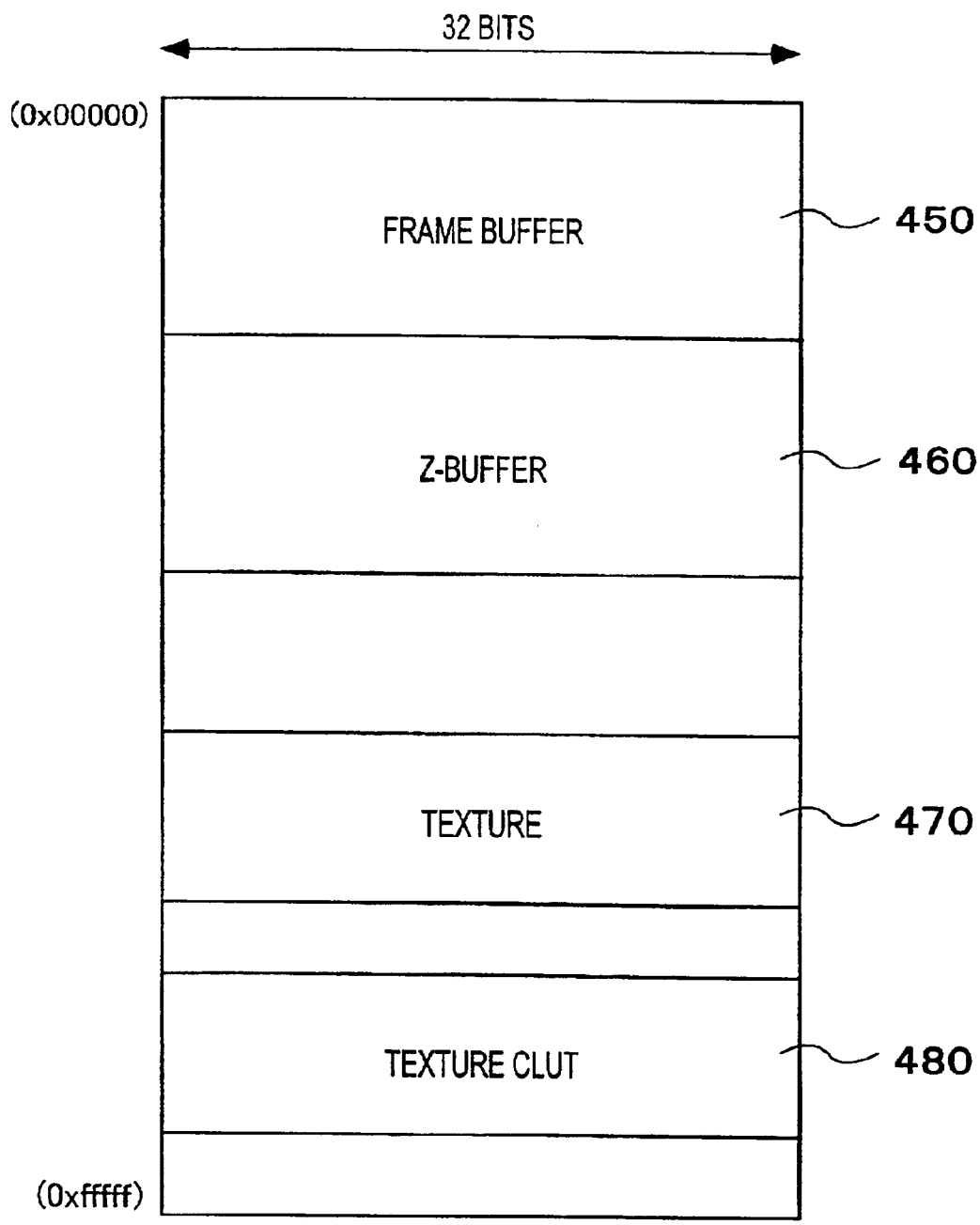
FIG. 4 is a diagram illustrating the constitution of a local memory 420.

FIG. 4 is a diagram illustrating the constitution of the local memory 420. As shown in FIG. 4, the local memory 420 includes a frame buffer region 450, a Z-buffer region 460, a texture buffer region 470 and a texture CLUT region 480.

The frame buffer region 450 and the Z-buffer region 460 are the regions for drawing; i.e., the frame buffer region 450 is for storing pixels of the drawn results, and the Z-buffer region 460 is for storing the Z values of the results of drawing.

The texture buffer region 470 stores image data of the texture, and the texture CLUT region 480 stores a color look-up table (CLUT) that is used when the textures are index colors.

Upon setting suitable values to a predetermined control register, the regions 450 to 480 can be freely arranged at any addresses in any order on the local memory 420.

Next, described below is the outline of the DVD video reproduction processing in the entertainment device of the present invention. The DVD video reproduction processing is executed when, for example, a DVD reproduction software loaded onto the main memory 160 from a memory card is executed by the main CPU 100.

When a DVD video reproduction is instructed by a user, the CD/DVD reader unit 130 reads the video data stored in the DVD, and transfers the video data that are read out to the main memory 160 via the IOP 120.

The main CPU 100 subjects the video data (MPEG2 bit stream) stored in the main memory 160 to the MPEG2 decoding to, first, form image data (YCbCr pixel data) of the YCbCr format, then, executes color-space conversion, and forms image data (RGBA pixel data) of the RGB form. The thus formed image data of the RGB format are transferred to the graphic processor 110 so as to be displayed on a display unit. At this moment, Y (brightness) data are also sent to the graphic processor 110 together with the RGB data.

That is, the data of a total of 32 bits, i.e., 8 bits for each of the pixels or RGBY, are transferred to the graphic processor 110.

The RGB data and Y data sent to the graphic processor 110 are stored, as texture data, in the texture buffer region 470 of the local memory 420 in the graphic processor 110.

Figure 5A:
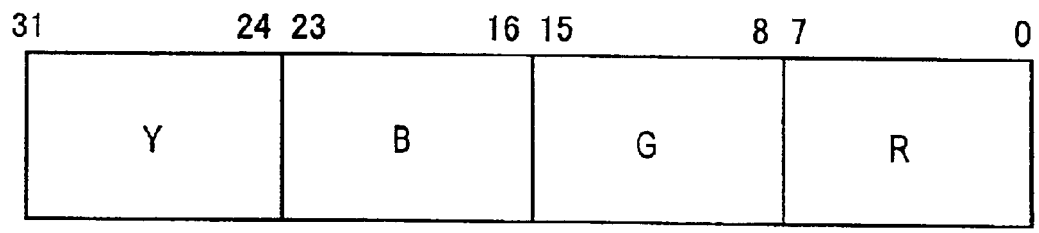
FIGS. 5(a) and 5(b) are diagrams illustrating respective a formats for storing texture pixels.

FIG. 5(a) is a diagram illustrating a format of storing the RGB data in the texture buffer region 470. As shown in FIG. 5(a), data R is stored in the bits [7:0], data G is stored in the bits [15:8], data B is stored in the bits [23:16], and data Y is stored in the bits [31:24]. Usually, alpha data is stored in the bits [31:24].

The graphic processor 110 supports plural formats for storing texture pixels in addition to the format shown in FIG. 5(a). These plural formats can be used being changed over by changing the setting of a particular control register.

Figure 5B:
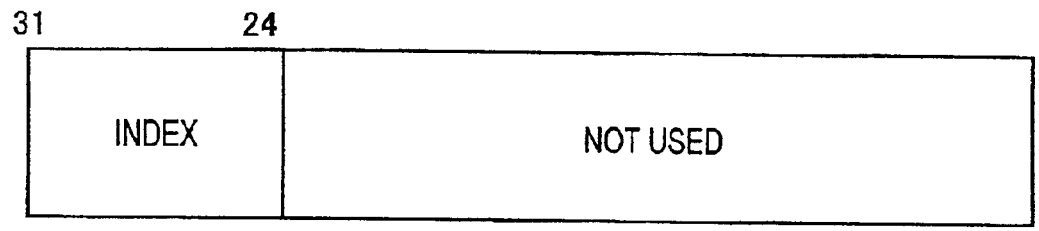

FIG. 5(b) is a diagram illustrating another format for storing texture pixels in the graphic processor 110. In this format as shown in FIG. 5(b), the upper 8 bits form an index for the color look-up table stored in the texture CLUT region 480. In this case, the color look-up table has 256 entries. A color value corresponding to the index value is stored in each entry of the color look-up table. The case of utilizing this format will be described later.

In this embodiment, the edge-enhancing processing is effected for the image data (RGBY data) transferred to the texture buffer region 470.

Figure 6:
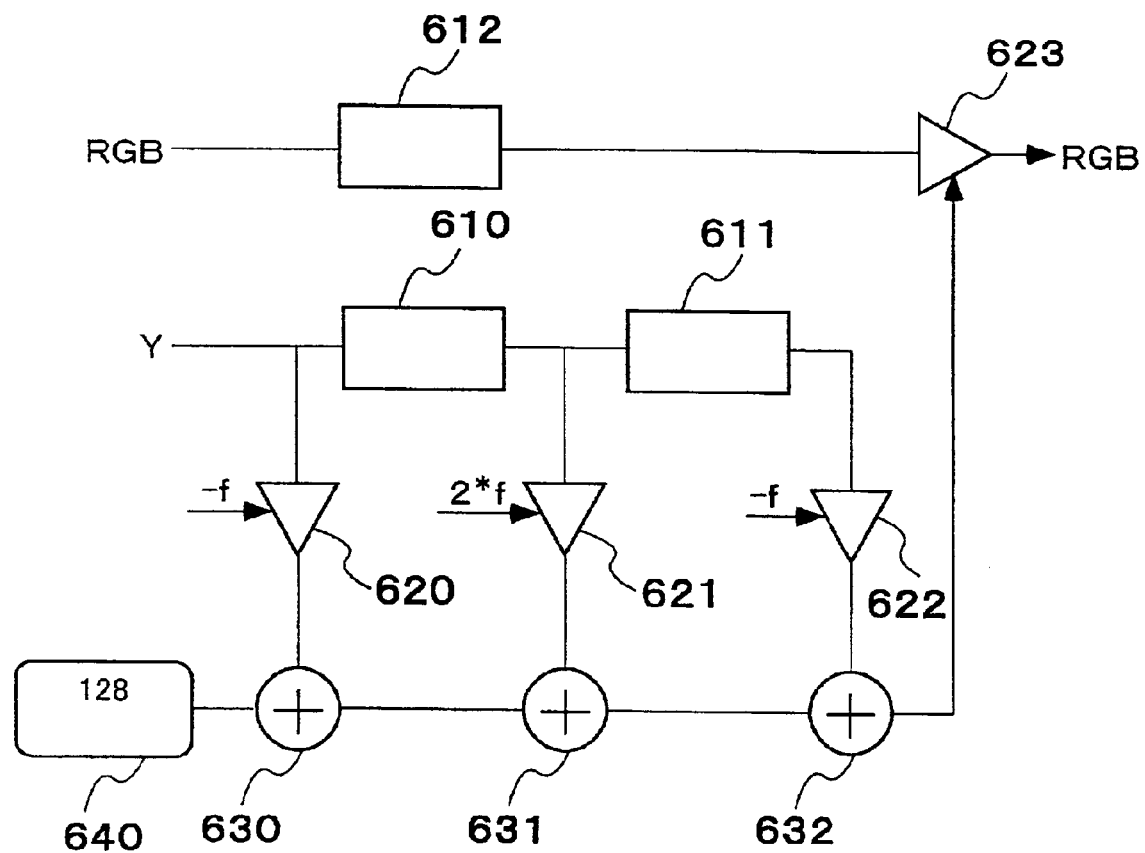
FIG. 6 is a diagram illustrating the constitution of an edge-enhancing filter.

FIG. 6 is a diagram illustrating an equivalent flow of the edge-enhancing filter according to this embodiment. The edge-enhancing filter is a convolution filter in the transverse (horizontal) direction only, and calculates the coefficient of filter processing by using brightness data of the right and left neighboring pixels.

As shown in FIG. 6, the edge-enhancing filter includes delay units 610, 611, 612, coefficient multiplier units 620, 621, 622, 623, adder units 630, 631, 632, and the offset constant unit 640. Here, each of RGB is multiplied by the same coefficient calculated from the data Y to find final values RGB, respectively. Here, the digital filters illustrated in FIG. 1 are provided for each of RGB, and each of RGB may be multiplied by a separate coefficient calculated for each of RGB, to find final values RGB. In this case, for example, the edge-enhancing filter for R works to multiply the input signal R by a coefficient calculated from R to obtain a final value R.

In the edge-enhancing filter shown in FIG. 6, RGBY are each constituted by 8 bits, and the coefficients in the coefficient multiplier units 620 to 623 are multiplied by using 8 bits×8 bits multipliers. In the adder units 630 to 632, further, the addition is executed by using 8-bit adders.

An offset constant in the offset constant unit 640 is 0×80 (=128). Here, the coefficient at the time of multiplication is that 0×80 (=128) is 1.0. That is, when the coefficient is 0×80 (=128), the multiplier for each of RGB becomes 1.0.

Further, a value f is for controlling the intensity of edge enhancement and assumes from 0 to 64. The value f is set to an intensity preferred by the user.

Next, described below is an image filter processing by using the graphic processor 110. The filter processing using the graphic processor has been generally described in Japanese Patent Application No. 138043/1998.

Figure 7:
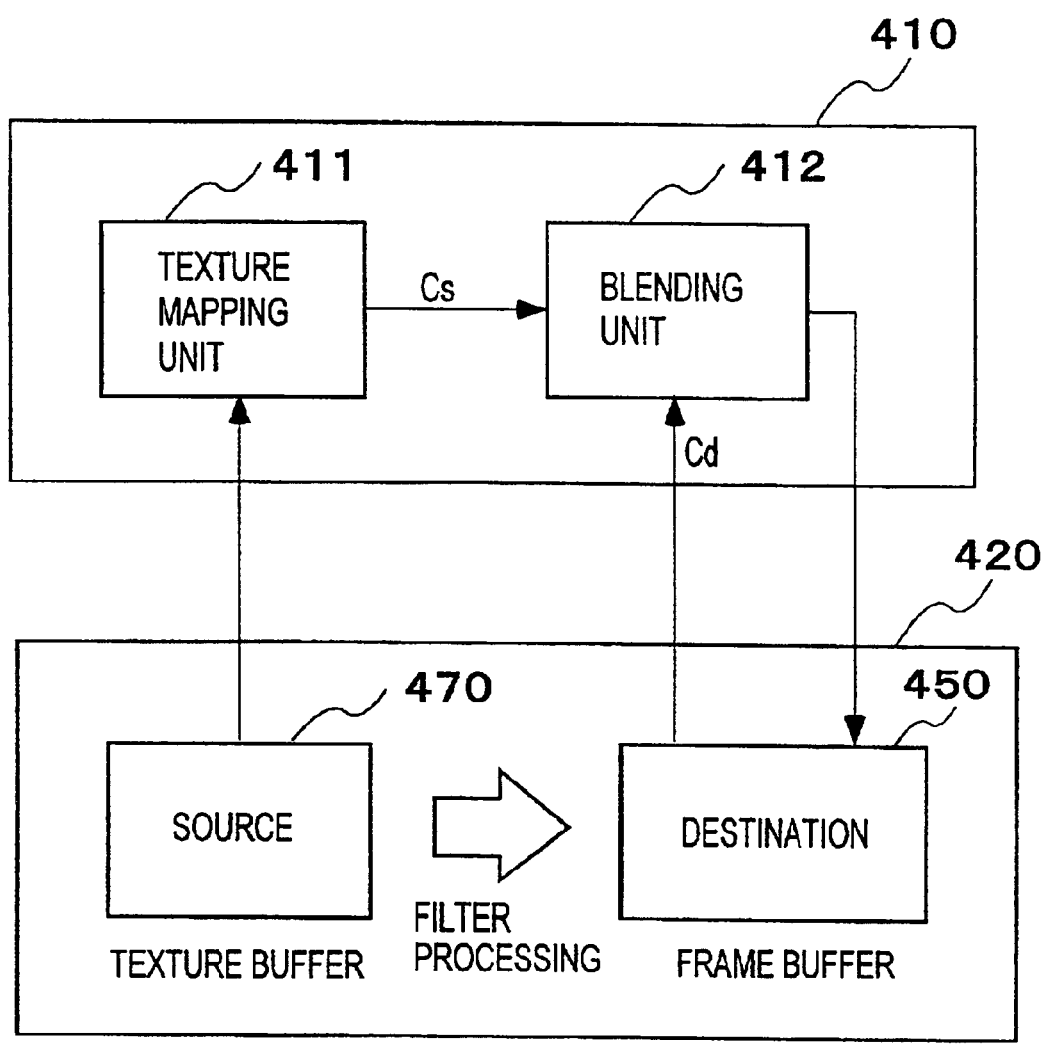
FIG. 7 is a diagram illustrating the outline of image filter processing by using the graphic processor 110.

FIG. 7 is a diagram illustrating the outline of an image filter processing by using the graphic processor 110. As shown in FIG. 7, a drawing function block 410 in the graphic processor 110 includes a texture mapping unit 411 and a blending unit 412. The filter processing is executed by utilizing the texture mapping function and the blending function of the graphic processor 110.

That is, image data (source data) of the RGBY format decoded by MPEG2 are transferred to the texture buffer region 470, and the drawing is processed by effecting the texture mapping turned on and the blending turned on. The texture mapping unit 411 thereby multiplies the source data by a predetermined coefficient. The blending unit 412 subjects the source data multiplied by the predetermined coefficient and the data (destination data) in the frame buffer region 450 to the mixed mode operation (addition and subtraction). The blending unit 412 writes the result into the frame buffer region 450. The texture mapping unit 411 and the blending unit 412 repeats the above processings.

Next, the blending (mixed mode processing) function of the graphic processor 110 will be described. The graphic processor 110 effects the blending function to calculate the blending between an output color (source color) Cs after the texture mapping and a pixel color (destination color) Cd in the frame buffer region.

A basic form of the blending function is as follows:

$$Cv=(A-B)\times C>>7+D$$

where Cv=output color value,
A, B, D=input color values, and
C=input α value.

The graphic processor 110 can suitably set the register for controlling the blending and vary A, B, C and D as described below.

As the input color values A, B and D, there can be selected any one of the RGB values Cs of source, RGB values Cd on the frame buffer region or 0, respectively. As the input α value C, there can be selected any one of alpha value of source, alpha value on the frame buffer region, or a fixed alpha value set to the register for controlling the blending.

The main CPU 100 realizes the filtering operation (sum-of-product operation) by executing a required blending processing by suitably setting a control register in the graphic processor 110.

Next, described below is a specific command for instructing the graphic processor 110 at the time of executing the image filter processing.

FIG. 8 is a diagram illustrating a group of commands which the main CPU 100 sends to the graphic processor 110 in executing the image filter processing. In the commands shown, d*(dRGB, etc.) represents a destination surface and s*(sY, etc.) represents a source surface.

First, an edge-enhancing coefficient f is set (S1). For example, a value which the user has specified out of his liking is set.

Next, offset values OFFX and OFFY are set to be 0, and the offset constant 0×80 (=128) is set to the RGB surfaces of the destination region (frame buffer region) (S2). Here, the processing is instructed to the graphic processor 110 in a unit of a plane. In this case, the graphic processor 110 executes the processing for every pixel in a predetermined plane (rectangular region). Therefore, the RGB values of the pixels in the destination region are initialized to 0×80 (=128), respectively.

Next, the offset value OFFX is set to be −1, and each of the pixels is operated by using brightness data of the left neighboring pixel (S3). That is, the brightness (Y) data of a pixel just on the left side of the pixel being processed is multiplied by the coefficient f, and the result is subtracted from the RGB value of the pixel being processed. This processing is also executed in a unit of a plane.

Here, it becomes necessary to execute the blending between the Y value of the source region (texture buffer region) multiplied by the coefficient f and the RGB values of the destination region. As shown in FIG. 5(a), however, the Y value has been stored in the upper 8 bits which cannot be blended with the RGB values in the destination region. Here, therefore, the texture pixels stored in the texture buffer region 470 are treated as having a format shown in FIG. 5(b). That is, the Y value is treated as an index value of CLUT stored in the texture CLUT region 480, and the color values stored in the respective entries of CLUT are used for the practical processing. Accompanying this handling, the value same as the index is input to each of the RGB of the entries (0 to 255) of the CLUT in advance. For example, "1", "1", "1" are stored for the RGB of the entry 1, and "255", "255" and "255" are stored for the RGB of the entry 255.

This substantially makes it possible to effect the blending between the Y value of the source region multiplied by the coefficient f and the RGB values of the destination region. This also holds in the following steps S4 to S6.

Next, the offset value OFFX is returned to 0, and the operation is executed by using its own brightness data for each of the pixels (S4). That is, the brightness data of the pixel to be treated is multiplied by the coefficient f, and the result is added to the RGB values of the pixel being processed. This processing is also executed in a unit of a plane. Here, since the coefficient f assumes a value over a range of from 0 to 128, the dynamic range of f is guaranteed by dividing the operation which is added by being multiplied by 2f into two times of operations which are added by being multiplied by f. Here, the addition is the first one.

Next, the offset value OFFX is set to be 1, and the operation is executed for each of the pixels by using brightness data of a pixel which is just on the right side (S5). That is, the brightness data of a pixel just on the right side of the pixel being processed is multiplied by the coefficient f, and the result is subtracted from the RGB values of the pixel being processed. This processing is also executed in a unit of a plane.

Next, the offset value OFFX is returned to 0, and the operation is executed by using its own brightness data for each of the pixels (S6). That is, the brightness data of the pixel being processed is multiplied by the coefficient f, and the result is added to the RGB values of the pixel being processed. The addition of this time is the second one of the operation that is added by being multiplied by 2f and is divided into two.

After the above operation, the coefficient that is to be finally multiplied upon the original data is stored in the RGB values in the destination region. Next, in order to obtain the products of this coefficient and the RGB values of the source region, the coefficient is copied into the α surface (upper 8 bits) from the RGB surfaces of the destination region (S7). The same value has been stored in the RGB surfaces. Here, therefore, the data of the G surface is copied onto the α surface.

Then, finally, the products of each RGB value in the source region and the coefficient stored in the α surface in the destination region are obtained, and the results are stored in the RGB surfaces of the destination region (S8).

Through the above processing, the RGB values obtained by subjecting the image data stored in the source region to the edge-enhancing filter processing, are stored in the RGB surfaces in the destination region.

In the above embodiment, the edge-enhancing filter is realized by using the graphic processor 110. The edge-enhancing filter, however, may be mounted by using a general-purpose DSP or a dedicated hardware.

In the edge-enhancing filter according to this embodiment as described above, first, the coefficient is calculated and, finally, a product of the calculated coefficient and the original data is obtained, eliminating the cancellation of the original data and offering vivid gradation of the image.

As described above in detail, this invention makes it possible to realize a digital filter permitting the input data to be little canceled even by using an operation unit having a short word length.

What is claimed is:

1. A digital filter, comprising:

a coefficient calculator unit operable to calculate a coefficient by a sum-of-products operation carried out on each of a plurality of units of input data; and a multiplier unit operable to multiply a particular unit of input data only once, by the coefficient, to produce a unit of output data as a filtered version of the particular unit of input data, wherein each of the units of input data at least partially represents an individual pixel of an image, such that at least one particular unit of the units of input data at least partially represents a) a first pixel, b) at least one of the units of input data at least partially represents a second pixel disposed to a first side of the first pixel, and c) at least one of the units of input data at least partially represents a third pixel disposed to a second side of the first pixel opposite the second pixel.

2. A digital filter as claimed in claim 1, wherein the unit of output data represents a blending of the particular unit of input data and the units of input data disposed to the left and right sides of the particular unit of input data to enhance an edge of an element of the image.

3. A digital filter, comprising:

a coefficient calculator unit operable to calculate a coefficient by a sum-of-products operation carried out on each of a plurality of units of input data; and a multiplier unit operable to multiply a particular unit of input data only once, by the coefficient, to produce a unit of output data as a filtered version of the particular unit of input data, wherein each of the units of input data includes a unit of brightness data and a unit of color data, the sum-of-products operation being carried out on respective ones of the units of brightness data, and the multiplier unit being operable to multiply the color data of the particular unit of input data by the coefficient to produce the unit of output data.

4. A digital filter for processing image data, the image data including a plurality of units of pixel data, each of said units of pixel data including brightness data and a RGB value, said filter comprising:

coefficient calculation means operable to calculate a coefficient by performing a sum-of-products operation for each of the plurality of units of pixel data; and correcting means including a multiplier operable to multiply in one multiplication operation the RGB value of each unit of pixel data by the coefficient calculated by the coefficient calculation means to correct the RGB value of the unit of pixel data, wherein said coefficient calculation means is operable to perform said sum-of-product operation to calculate said coefficient for each given unit of pixel data by adding the following values together:

a value obtained by multiplying, by a predetermined value f, brightness data of the unit of pixel data immediately to the left of the given unit of pixel data;

a value obtained by multiplying brightness data of the given unit by a value −2f; and a value obtained by multiplying brightness data of the unit of pixel data immediately to the right of the given unit of pixel data by the predetermined value f.

5. A digital filtering method, comprising:

calculating a coefficient by a sum-of-products operation carried out on each of a plurality of units of input data; and multiplying a particular unit of input data only once, by the coefficient, to produce a unit of output data as a filtered version of the particular unit of input data, wherein each of the units of input data at least partially represents an individual pixel of an image, such that at least one particular unit of the units of input data at least partially represents a first pixel, at least one of the units of input data at least partially represents a second pixel disposed to a first side of the first pixel, and at least one of the units of input data at least partially represents a third pixel disposed to a second side of the first pixel opposite the second pixel.

6. A digital filtering method as claimed in claim 5, wherein the unit of output data represents a blending of the particular unit of input data and the units of input data disposed to the left and right sides of the particular unit of input data to enhance an edge of an element of image.

7. A digital filtering method, comprising:
calculating a coefficient by a sum-of-products operation carried out on each of a plurality of units of input data; and
multiplying a particular unit of input data only once, by the coefficient, to produce a unit of output data as a filtered version of the particular unit of input data, wherein each of the units of input data includes a unit of brightness data and a unit of color data, the sum-of-products operation being carried out on respective ones of the units of brightness data, the color data of the particular unit of input data being multiplied by the coefficient to produce the unit of output data.

8. A digital filtering method for processing image data, the image data including a plurality of units of pixel data, each of said units of pixel data including brightness data and a RGB value, said method comprising:
calculating a coefficient by performing a sum-of-product operation for each of the plurality of units of pixel data by adding the following values together:
a value obtained by multiplying, by a predetermined value f, brightness data of the unit of pixel data immediately to the left of the given unit of pixel data;
a value obtained by multiplying brightness data of the given unit by a value −2f; and
a value obtained by multiplying brightness data of the unit of pixel data immediately to the right of the given unit of pixel data by the predetermined value f; and
correcting each of the plurality of units of pixel data by multiplying in one multiplication operation the RGB value of the unit of pixel data by the calculated coefficient.

9. A recording medium having recorded thereon instructions for performing a digital filtering method, the method comprising:
calculating a coefficient by a sum-of-products operation carried out on each of a plurality of units of input data; and
multiplying a particular unit of input data only once, by the coefficient, to produce a unit of output data as a filtered version of the particular unit of input data, wherein each of the respective units of input data at least partially represents an individual pixel of an image, such that at least one particular unit of the units of input data at least partially represents a first pixel, at least one of the units of input data at least partially represents a second pixel disposed to a first side of the first pixel, and at least one of the units of input data at least partially represents a third pixel disposed to a second side of the first pixel opposite the second pixel.

10. A recording medium as claimed in claim 9, wherein the unit of output data represents a blending of the particular unit of input data and ones of the respective units of input data disposed to the left and right sides of the particular unit of input data to enhance an edge of an element of the image.

11. A recording medium having recorded thereon instructions for performing a digital filtering method, the method comprising:
calculating a coefficient by a sum-of-products operation carried out on each of a plurality of units of input data; and
multiplying a particular unit of input data only once, by the coefficient, to produce a unit of output data as a filtered version of the particular unit of input data, wherein each of the units of input data includes a unit of brightness data and a unit of color data, the sum-of-products operation being carried out on respective ones of the units of brightness data, and the instructions including instructions to multiply the unit of color data of the particular unit of input data by the coefficient to produce the unit of output data.

12. A recording medium having recorded thereon instructions for performing a digital filtering method for processing image data, the image data including a plurality of units of pixel data, each of said units of pixel data including brightness data and a RGB value, the method comprising:
calculating a coefficient by performing a sum-of-products operation for each of the plurality of units of pixel data by adding the following values together:
a value obtained by multiplying, by a predetermined value f, brightness data of the unit of pixel data immediately to the left of the given unit of pixel data;
a value obtained by multiplying brightness data of the given unit by a value −2f; and
a value obtained by multiplying brightness data of the unit of pixel data immediately to the right of the given unit of pixel data by the predetermined value f; and
correcting each of the plurality of units of pixel data by multiplying in one multiplication operation the RGB value of the unit of pixel data by the calculated coefficient.

13. A system, comprising:
a processor operable to execute instructions; and
instructions for performing a digital filtering method, the method comprising:
calculating a coefficient by a sum-of-products operation carried out on each of a plurality of units of input data; and
multiplying a particular unit of input data only once, by the coefficient, to produce a unit of output data as a filtered version of the particular unit of input data, wherein each of the respective units of input data at least partially represents an individual pixel of an image, such that at least one particular unit of the units of input data at least partially represents a first pixel, at least one unit of the units of input data at least partially represents a second pixel disposed to a first side of the first pixel, and at least one unit of the units of input data at least partially represents a third pixel disposed to a second side of the first pixel opposite the second pixel.

14. A system as claimed in claim 13, wherein the unit of output data represents a blending of the particular unit of input data and the units of input data disposed to the left and right sides of the particular unit of input data to enhance an edge of an element of the image.

15. A system, comprising:
a processor operable to execute instructions; and instructions for performing a digital filtering method, the method comprising:
calculating a coefficient by a sum-of-products operation carried out on each of a plurality of units of input data; and
multiplying a particular unit of input data only once, by the coefficient, to produce a unit of output data as a filtered version of the particular unit of input data, wherein each of the units of input data includes a unit of brightness data and a unit of color data, the sum-of-products operation is being carried out on respective ones of the units of brightness data, and the instructions including instructions to multiply the color data of the particular unit of input data by the coefficient to produce the unit of output data.

16. A system, comprising:

a processor operable to execute instructions; and instructions for performing a digital filtering method, the method comprising:

calculating a coefficient by performing a sum-of-products operation for each of the plurality of units of pixel data by adding the following values together:

a value obtained by multiplying, by a predetermined value f, brightness data of the unit of pixel data immediately to the left of the given unit of pixel data;

a value obtained by multiplying brightness data of the given unit by a value −2f; and a value obtained by multiplying brightness data of the unit of pixel data immediately to the right of the given unit of pixel data by the predetermined value f; and correcting each of the plurality of units of pixel data by multiplying in one multiplication operation the RGB value of the unit of pixel data by the calculated coefficient.

* * * * *